United States Patent [19]

Tsuda et al.

[11] Patent Number: 5,068,668

[45] Date of Patent: Nov. 26, 1991

[54] ADAPTIVE POLARIZATION COMBINING SYSTEM

[75] Inventors: George I. Tsuda, Fullerton; Dan E. Snyder, La Mirada, both of Calif.

[73] Assignee: Hughes Aircraft Company, Los Angeles, Calif.

[21] Appl. No.: 403,427

[22] Filed: Sep. 6, 1989

[51] Int. Cl.$^5$ ........................ H01Q 21/06; H03H 5/00

[52] U.S. Cl. ................................ 342/362; 333/28 R; 333/21 A

[58] Field of Search ............... 342/361, 362, 363, 364, 342/365, 366; 333/28 R, 21 R, 21 A

[56] References Cited

U.S. PATENT DOCUMENTS

| | | | |
|---|---|---|---|
| 3,523,294 | 8/1970 | Okamura et al. | 342/366 |
| 3,943,517 | 3/1976 | Vogt | 342/362 |
| 4,107,678 | 8/1978 | Powell | 342/62 |
| 4,191,926 | 3/1980 | Pontano et al. | 325/476 |
| 4,220,923 | 9/1980 | Pelchat et al. | 455/295 |
| 4,268,829 | 5/1981 | Baurle et al. | 342/380 |
| 4,280,128 | 7/1981 | Masak | 342/380 |
| 4,283,795 | 8/1981 | Steinberger | 455/283 |
| 4,293,858 | 10/1981 | Hockham | 343/731 |
| 4,298,873 | 11/1981 | Roberts | 342/375 |
| 4,310,813 | 1/1982 | Yuuki et al. | 333/117 |
| 4,313,220 | 1/1982 | Lo et al. | 455/304 |
| 4,369,519 | 1/1983 | Yuuki et al. | 455/60 |
| 4,438,530 | 3/1984 | Steinberger | 455/278 |
| 4,577,330 | 3/1986 | Kavehrad | 375/15 |
| 4,606,054 | 8/1986 | Amitay et al. | 375/102 |
| 4,644,562 | 2/1987 | Kavehrad et al. | 375/14 |
| 4,723,321 | 2/1988 | Saleh | 455/295 |
| 4,757,319 | 7/1988 | Lankl | 342/378 |

FOREIGN PATENT DOCUMENTS

| | | | |
|---|---|---|---|
| 0067743 | 4/1984 | Japan | 342/361 |

OTHER PUBLICATIONS

Alves et al., Arbitrary Polarization Microwave Receiver Applied to OTS Reception, Electronics Letters vol. 15; No. 20 9/27/79.

Lamberty et al., Interference Suppression Using an Adaptive Polarization Combiner; Proc. of 1987 Antenna Applications Symposium Allerton Park, Sep. 23-25, 1987 pp. 1-15.

*Primary Examiner*—Gregory C. Issing

*Attorney, Agent, or Firm*—Wanda K. Denson-Low

[57] ABSTRACT

An adaptive polarization combining system automatically adjusts the polarization of a polarization diverse antenna to match that of the incoming RF signal, thereby maximizing the received signal-to-noise ratio. Signals from the orthogonally polarized ports of the antenna are passed through a variable combiner circuit which is adjusted to maximize the combined signal at a single output port. Sample signals from each antenna port are provided to a calibration circuit which obtains phase and amplitude information from the two orthogonally polarized received signals and uses this information to control the combiner circuit phase shifters to adapt the combiner circuit to the polarization of the received signals. Therefore, the combining system can rapidly adapt electronically to polarization changes in the received signals.

10 Claims, 4 Drawing Sheets

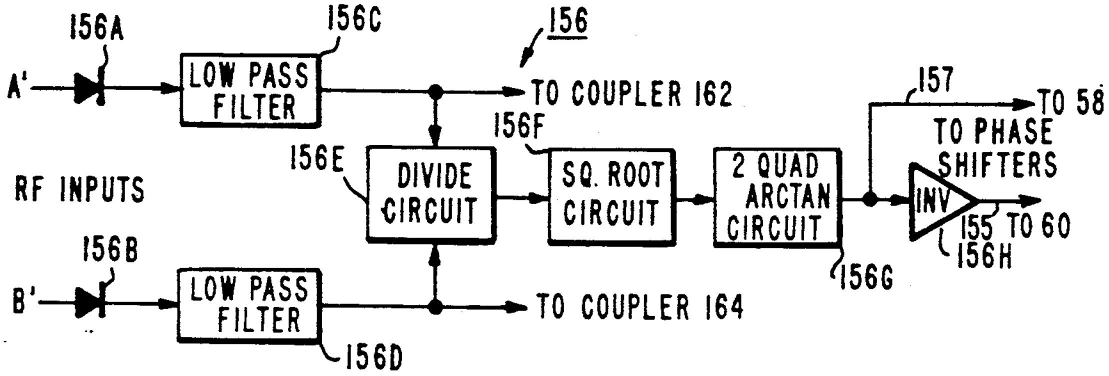
Fig. 4
Fig. 5
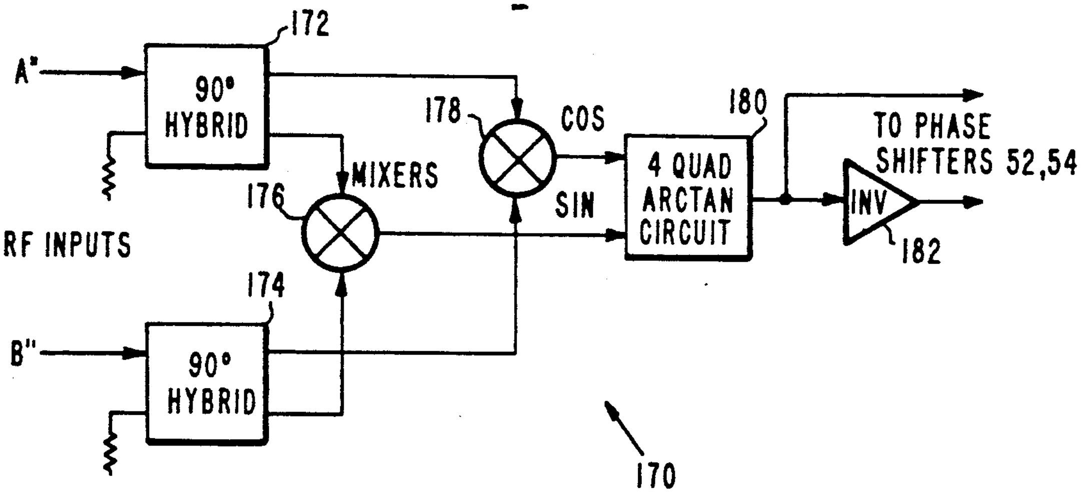

ADAPTIVE POLARIZATION COMBINING SYSTEM

This invention was made with Government support. The Government has certain rights in this invention.

BACKGROUND OF THE INVENTION

The present invention relates to electromagnetic signal receiving systems, and more particularly to a receiving system wherein the polarization of the receive antenna is matched to that of the incoming RF signal, thereby maximizing the received signal-to-noise ratio.

In many instances, the polarization of the receive signals is not known or may vary due to ionospheric attenuation and reflection, multipath interference or geometric relationship between the source and the receiving antenna. In certain instances, it is possible that the polarization of the signal at the source may be varying for one reason or another.

Generally, the polarization of the receive antenna is made to match to that of the incoming signal. However, when the polarization of the receive signal is not known or tends to change, a polarization diverse antenna is generally used. This type of antenna receives either two orthogonal linearly or circularly polarized signals. For the maximum reception of the incoming signal, these two orthogonally polarized components must be matched in relative phase and amplitude to that of the incoming signal. If only one component is used, which is generally the case, no signal may be received if the received signal polarization is orthogonal.

It is well known that any receive signal can be decomposed into two linear components with certain relative phase. In other words, a complete polarization match can be made by adjusting the relative phase and amplitudes of the two orthogonal linearly polarized signals. Schemes for matching the incoming polarization have been considered for high performance space communication systems where signal levels from deep space probes are often very marginal. These schemes primarily have used mechanical polarization adjustment systems. Although not directly related, polarization mismatching schemes are used for adaptive nulling of the jammer signals. However, none of these schemes require the polarization to be matched in very short time without losing any information, that is, from pulse to pulse.

SUMMARY OF THE INVENTION

It is therefore an object of the invention to provide a system which adaptively and electronically adjusts the polarization of a receive antenna to match that of the incoming RF signal to maximize the received signal-to-noise ratio.

A further object of the invention is to provide an adaptive combining system which electronically adapts to the polarization of the received signal without any prior knowledge or cooperation of the signal, and without losing any signal information.

It is a further object of the invention to provide an adaptive polarization combining system which electronically adapts to the polarization of the received signal, and operates over a wide instantaneous bandwidth and can process a wide range of received pulse lengths from CW to very short pulses.

The adaptive polarization combiner system in accordance with the invention comprises a receive antenna, preferably a polarization diverse antenna providing first and second output port signals which comprise orthogonally polarized components of the incoming signal. In a general sense, the antenna provides first and second signal components of respective first and second polarization senses.

The combiner system further comprises an adaptive combiner circuit responsive to the first and second signal components and comprising means for electronically adjusting the phase and amplitude of the respective first and second component signals, and for combining the adjusted signals at a single output port to polarization match the system to the polarization of the received signal and to maximize the signal-to-noise ratio of the output signal.

A calibration circuit is responsive to samples of the first and second component signals to determine the relative amplitude and phasing of the two component signal. Calibration circuit signals dependent on the relative amplitude and phase are then used to adaptively adjust the combining circuit to the polarization of the incoming signal.

BRIEF DESCRIPTION OF THE DRAWINGS

These and other features and advantages of the present invention will become more apparent from the following detailed description of exemplary embodiments thereof, as illustrated in the accompanying drawings, in which:

FIG. 4 is a schematic block diagram illustrative of the amplitude detector comprising the calibration circuit of FIG. 3.

FIG. 5 is a schematic block diagram illustrative of the phase detector comprising the calibration circuit of FIG. 3.

DETAILED DESCRIPTION OF THE PREFERRED EMBODIMENT

A polarization diverse receive antenna generally has a capability of receiving two linearly or two circularly polarized signals. With appropriate phase and amplitude adjustments of these two orthogonally polarized signals, the polarization can be matched to that of the incoming signal. Generally this process takes some finite time and may cause the receiver to lose some of the signals. To circumvent any losses of these signals, a scheme is required where any polarization matching is extremely fast, that is, matching the phase and amplitude of the two orthogonally polarized components adaptively. This process must be fast enough so that no information is lost in any communication waveform, no pulses are lost in radar signals, and bandwidth must be sufficient to handle frequency-hopping-type signals.

Figure 1:
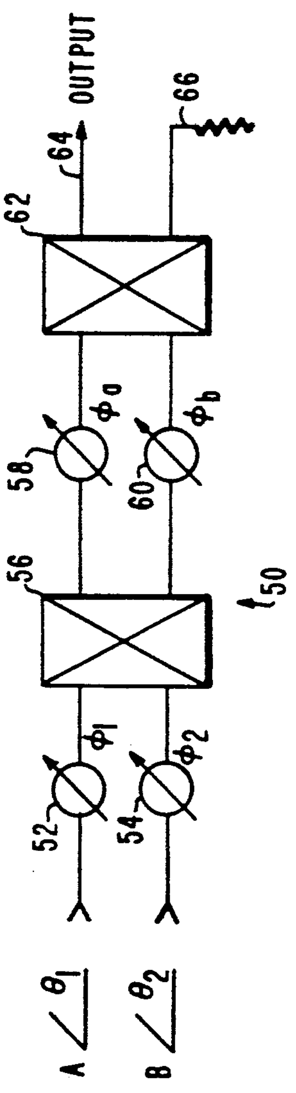
FIG. 1 is a simplified schematic block diagram of a combining circuit useful for polarization matching the receive antenna to the incident RF signal.

The basic concept of polarization matching to the incoming signal is shown schematically in FIG. 1. It is assumed that a single signal source within the frequency band of interest is incident on a polarization diverse antenna having the two orthogonally polarized ports A and B. The polarization diverse receive antenna system can comprise, e.g., a dual polarized antenna such as a dual circularly polarized antenna or dual orthogonal linear polarization antenna structure. The signals at ports A and B can have any relative amplitude and phase. Thus, the signal at port A can be characterized as having an amplitude A and a phase $\theta_1$. The signal at port B can be characterized as having an amplitude B and a phase $\theta_2$.

The combiner circuit 50 includes variable phase shifters 52 and 54 for respectively shifting the phase of the signals at port A and port B by phase shifts $\phi_1$ and $\phi_2$. The The outputs of the phase shifters 52 and 54 are connected to the inputs of a 90° hybrid coupler 56. The two outputs of the hybrid coupler 56 are in turn connected to the respective inputs of a second 90° hybrid coupler 62 through variable phase shifters 58 and 60. The phase shifters 58 and 60 vary the phase by respective phase shift values $\phi_a$ and $\phi_b$. One of the outputs 64 of the second hybrid coupler 64 is taken as the combiner circuit output; the other output port is connected to a matched load 66.

By the use of the 90 degree hybrids 56 and 62 and properly setting the phase shifters 52, 54, 58 and 60 it is possible to get all of the combiner circuit output at the desired output port 64 and none in the load 66. This is done by setting the phase shift values $\phi_1$ and $\phi_2$ such that the signals from ports A and B are in phase entering the first hybrid 56. In that case, the two outputs from the first hybrid 56 will be of equal amplitude but have a phase difference dependent on the relative amplitudes of the incident signals at ports A and B. The two equal amplitude signals are changed in phase by values $\phi_a$ and $\phi_b$ through phase shifters 58 and 60 such that the signals input into the second hybrid 62 are 90 degrees different in phase, but still equal in amplitude. The second 90 degree hybrid 62 will combine these two signals such that all of the power appears at the output port and none at the load port. In this case the signal at the output port 64 will be sum of the signal vectors of the following magnitudes and angles: $A/2(\theta_1+\phi_1+\phi_a)+A/2(\theta_1+\phi_1+\phi_b-180)+B/2(\theta_2+\phi_2+\phi_a-90°)+B/2(\theta_2+\phi_2+\phi_b-90°)$.

It is possible to use only one of phase shifters 52 and 54 and/or only one of phase shifters 58 and 60, and the choice of whether to use two phase shifters will depend on the specific hardware implementation.

The circuit 50 of FIG. 1 in general comprises a means for adjusting the relative phase of the port A and port B signals so that they are in phase, and a variable power combiner/divider circuit for combining the equal phase signals and providing signals split between the two output ports of the output hybrid. The polarization diverse antenna in conjunction with the combiner circuit 50, comprises an antenna system which can have an arbitrary polarization. In order to match the system to the polarization of the incoming signal and to maximize the signal-to-noise ratio of the combiner circuit, the circuit 50 is adjusted so that all the power of the equal phase signals is sent to the circuit output port 64.

Figure 2:
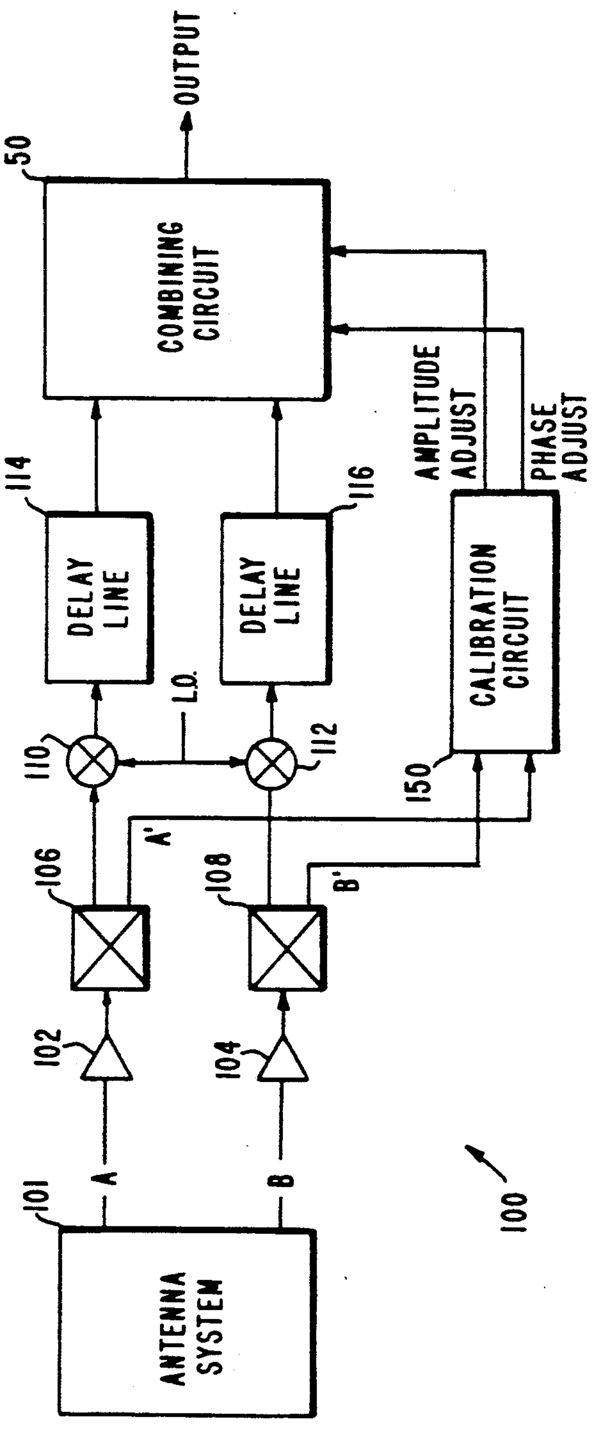
FIG. 2 is a simplified block diagram of a receive system employing an adaptive polarization matching circuit in accordance with the invention.

The combiner circuit from FIG. 1 is used in the adaptive polarization combining system of FIG. 2. The antenna system 101 has the two output ports A and B as described above. The A and B channels are pre-amplified by respective preamplifiers 102 and 104 prior to processing by the system 100 such that the signal-to-noise (S/N) ratio is maintained. Sample signals A′ and B′ are coupled off by the respective directional couplers 106 and 108 to the calibration circuit 150. The main signals A, B are mixed at mixers 110 and 112 with a local oscillator signal to down convert the main signal to the one GHz region, passed through respective delay lines 114 and 116 to delay the main signals to allow time for calibration, and the phase and amplitude of the combiner circuit is adjusted by the control signals from the calibration circuit. The calibration circuit 150 outputs control the settings of the phase shifters 52, 54, 58 and 60 of the combiner circuit 50 (FIG. 1). The sample signals A′ and B′ could alternatively be coupled off after down converting the main signals.

Figure 3:
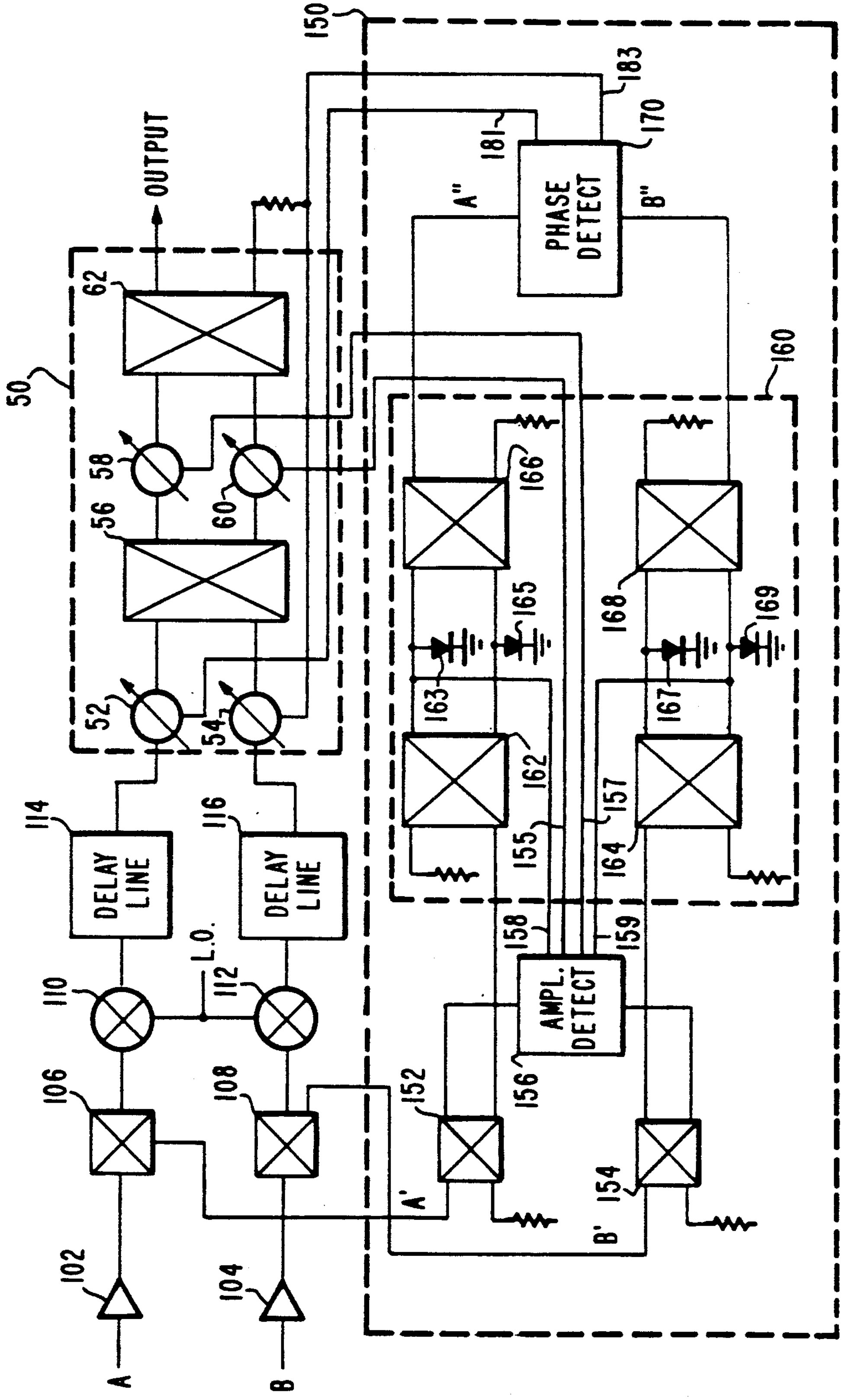
FIG. 3 is a more detailed block diagram of the receive system of FIG. 2.

The calibration circuit 150 is shown more fully in FIG. 3. The calibration sample signals A′ and B′ are input to respective 3 dB couplers 152 and 154. The signals from respective outputs of the couplers 152 and 154 are connected to an amplitude detector circuit 156. The amplitude detector circuit 156 accepts the two input signals, and outputs respective signals on lines 158, 159 which are related to the amplitudes of the input signals. The signals on lines 158, 159 are in turn used to set the attenuation levels of the variable attenuator circuit 160 of the calibration circuit. The signals 157 and 155, also output from the amplitude detector circuit 156, set the values of the phase shifters 58 and 60 comprising the combiner circuit 50.

Depending on the relative amplitudes of the signals A′ and B′, determined by the amplitude detector circuit 156, either the A′ channel signal or the B′ channel signal will be attenuated so that the signals A″ and B″ which are input to the phase detector 170 will be equal in amplitude. Only the larger of the A′ or B′ channel signals will be attenuated in order to maximize the signal level into the phase detector 170.

The balanced signals A″ and B″ enter the phase detector 170 and the output voltages (inverted and noninverted) determine the amount the phase shifters 52 and 54 have to be adjusted in the main channel combiner circuit 50. Settings of the phase detector values $\phi_a$, $\phi_b$, $\phi_1$, $\phi_2$ (FIG. 1) for several exemplary cases are given below.

| | |
|---|---|
| **Case 1. Signal A Channel Only (Signal B = 0)** | |
| Ampl. Det. | Maximum Voltage on Signal 157 |
| (156) | $\phi_a = -90°$, $\phi_b = +90°$ |
| | Channel A′ = Full Attenuation |
| Phase Det. | Zero Voltage |
| (170) | $\phi_1 = 0°$, $\phi_2 = 0°$ |
| **Case 2. Signal B Channel Only (Signal A = 0)** | |
| Ampl. Det. | Zero Voltage on Signal 157 |
| (156) | $\phi_a = 0°$, $\phi_b = 0°$ |
| | Channel B′ = Full Attenuation |
| Phase Det. | Zero Voltage |
| (170) | $\phi_a = 0°$, $\phi_b = 0°$ |
| **Case 3. Signal A & B Channels - In Phase, Equal Amplitude** | |
| Ampl. Det. | Midrange Voltage on Signal 157 |
| (156) | $\phi_a = -45°$, $\phi_b = 45°$ |
| Phase Det. | Zero Voltage |
| (170) | $\phi_1 = 0°$, $\phi_2 = 0°$ |
| **Case 4. Signal A & B Channels, In Phase, A = .707B** | |
| Ampl. Det. | About 39% of Maximum Voltage on Signal 157 |
| (156) | $\phi_a = -35.3°$, $\phi_b = +35.3°$ |
| | Channel B′ = Partial Attenuation (so that A″ = B″) |
| Phase Det. | Zero Voltage |
| (170) | $\phi_1 = 0°$, $\phi_2 = 0°$ |
| **Case 5. Signal A & B Channels, Equal Amplitude, Unequal Phase +180°** | |
| Ampl. Det. | Midrange Voltage on Signal 157 |
| (156) | $\phi_a = -45°$, $\phi_b = +45°$ |
| Phase Det. | Maximum |

-continued

| | |
|---|---|
| (170) | $\phi_1 = +90°$, $\phi_2 = -90°$ |
| Case 6. Signal A & B Channels, Equal Amplitude, Unequal Phase +90° | |
| Ampl. Det. | Midrange Voltage on Signal 157 |
| (156) | $\phi_a = -45°$, $\phi_b = +45°$ |
| Phase Det. | + Voltage |
| (170) | $\phi_1 = +45°$, $\phi_2 = -45°$ |

The couplers, hybrids, mixers, amplifiers, phase shifters and simple logic circuits comprising the system 100 are of conventional design and need not be described in further detail.

One of the components comprising the system 100 is the delay line used as delay devices 114 and 116. Generally, coaxial cable delay lines can be used where delay required is on the order of a few to a hundred nanoseconds. If a much longer delay is required, SAW devices can be considered. However, coaxial delay lines are adequate for most applications.

The calibration circuit 150 comprises the amplitude detector 156, variable attenuator circuit 160 and phase detector 170. The basic operation of this circuit is to first determine the relative amplitude of the signals from Channels A′ and B′ via the amplitude detector 156. The output voltage of the detector 156 will be sent to the variable attenuator 160 and to the combining circuit 50. This output voltage may be used in an analog or digital form to set the diode bias in the variable attenuator 160 or to set the appropriate bits for diode phase shifters 58 and 60.

The calibration circuit 150 must first determine the relative amplitudes of signals A′ and B′ so that the signals A″ and B″ can be made equal for phase comparison by the phase detector 170. The amplitude detector 156 accepts two input signals A′ and B′ and outputs signals related to the relative amplitudes of these signals. One implementation of the amplitude detector is shown in FIG. 4. The inputs A′ and B′ are square-law detected by the diodes 156A and 156B and low pass filters 154C and 156D. The resultant filter outputs are proportional to the square of the input amplitudes. These outputs are used to control the variable attenuators directly, with the channel A′ signals sent to the coupler 162 comprising the variable attenuator 160, and the B′ signal sent to the coupler 164. The control voltage required at the second pair of combiner phase shifters 58 and 60 for perfect combining is given by the formula $$V = -2\tan^{-1}(A/b)$$

where A and B are the amplitudes of the input signals and are positive or zero numbers. This voltage is derived from the detected signals by the divide circuit 156E, the square root circuit 156F, and the two quadrant inverse tangent circuits 156G. An inverted signal is also provided via inverter 156H for the other phase shifter of the differential pair.

The variable attenuator circuit 160 comprises two variable attenuator circuits; each is a non-reflective, non-phase-shift PIN diode attenuator circuit. The A′ channel attenuator comprises an input 3 dB, 90° hybrid coupler 162, a pair of matched PIN diodes 163 and 165 and an output 3 dB, 90° hybrid 166. The B′ channel attenuator comprises the input 3 dB, 90° hybrid coupler 164, matched PIN diodes 167 and 169, and the output 3 dB, 90° hybrid 168. The unused ports of the hybrids 162, 166, 164, and 168 are terminated in matched loads. The input coupler of each attenuator circuit divides the signal equally to both PIN diodes. When the diodes are zero-biased or reversed-biased, they will appear as open circuits which permits nearly all the signal to travel to the output hybrid coupler where the divided signals are combined at the hybrid output port. Any unbalance due to the diodes or the circuit will end up at the matched load of the output hybrid. When the PIN diodes are biased in the forward direction, the diodes draw current, the diode resistance decreases and the diodes absorb a portion of the signal while reflecting some of the signal back and into the matched load of the corresponding input hybrid. The remainder of the signal is combined in the output port of the output hybrid. Because the attenuation is performed by matched diodes there is no phase shift for any attenuation setting. If phase shifters are used in place of PIN diode attenuators, the output power is divided between the output port and the matched load of the output hybrid. This, however, results in phase shift at the output power depending on the phase shifter setting.

The phase detector 170 accepts two same frequency input signals of equal amplitude, and outputs a voltage proportional to the phase difference between the inputs. Thus, the phase detector exhibits the following mathematical relationship:

$$V_{out} = k(\phi_A - \phi_b),\ -180° < (\phi_A - \phi_B) < 180°$$

where $\phi_A$ and $\phi_B$ are the phases of the two input signals and k is the constant of proportionality. One implementation of the phase detector 170 is shown in FIG. 5. The inputs A″, B″ are split into a total of four signals by the 90° hybrid coupler 172 and the 0° hybrid coupler 174, which are compared in two double balanced mixers 176, 178 resulting in signals proportional to the sine and cosine of the phase difference. The sine and cosine signals are further processed by a four quadrant arctangent function circuit 180 which yields the desired output. An inverted signal is also provided via inverter 182 for driving the other phase shifter of the differential pair of phase shifters 52, 54.

The combining circuit 50 of FIG. 1, which follows the delay lines 114 and 116 of FIG. 3, consists of input phase shifters 52 and 54, an input three dB, 90 degrees hybrid coupler 56, power dividing phase shifters 58 and 60, and an output three dB, 90 degrees hybrid coupler 62. There are pairs of phase shifters shown in FIG. 1 and in FIG. 3, but only one phase shifter at the input and one phase shifter in between the hybrids are required. If one phase shifter is used, the values would just be doubled. For instance, instead of $\phi_1 = -45°$ and $\phi_2 = +45°$, $\phi_1$ could be set for $-90°$ or $\phi_2 = +90°$ eliminating one or the other phase shifters.

The phase shifts $\phi_a$ and $\phi_b$ are used to divide the signal from channel A and B appropriately, so that if the signals from A and B are in phase, the total signal will all emerge at the output port 64 and none at the matched load 66 of the output hybrid coupler 62. The settings of $\phi_a$ and $\phi_b$ are determined only by the amplitude of signals at port A relative to the amplitude of signals at port B. This measurement is performed by the amplitude detector 156 in the calibration circuit.

The settings $\phi_1$ and $\phi_2$ of the input phase shifters 52 and 54 are determined by the relative phase of the signals at ports A and B. These input phase shifters are adjusted appropriately so that the two signals A and B are in phase when they enter the output hybrid coupler 62 of the variable power divider.

Figure 6:
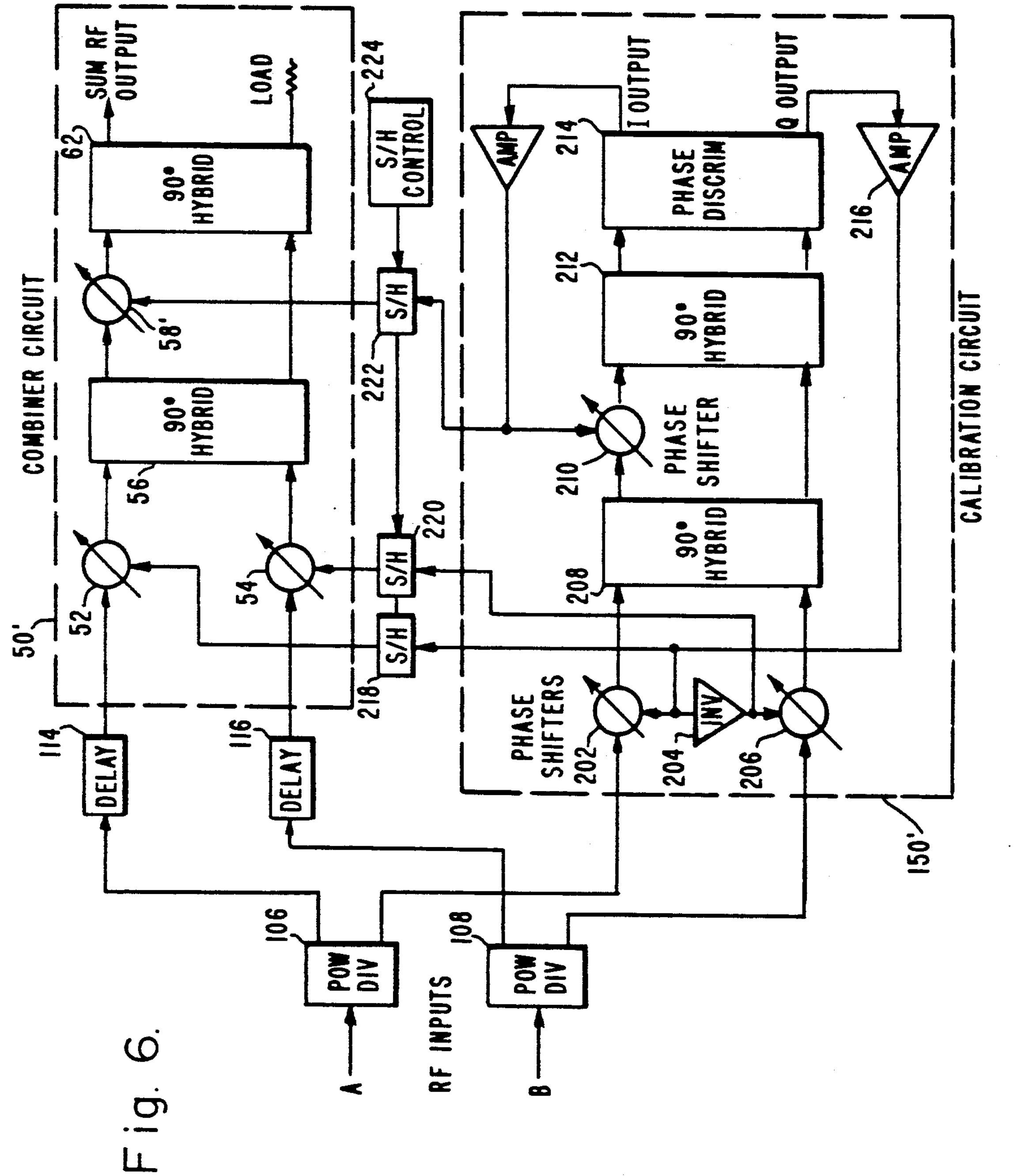
FIG. 6 is a schematic block diagram of an alternate adaptive polarization combining system.

An alternate calibration circuit 150′ is shown in FIG. 6. It has several differences compared to the circuit 150 of FIG. 3, including simplicity, use of feedback, and component matching. Because the calibration circuit 150′ is a simpler circuit, it is less expensive to build and is more reliable than the circuit of FIG. 3. The use of feedback automatically corrects for component imperfections and changes due to temperature and aging. Finally, because the calibration circuit 150′ has a high degree of commonality with the combiner circuit 50, the common components can be easily matched, resulting in decreased errors between the calibration and combining operations.

The alternate calibration circuit 150′ operates as follows. The two input signals are applied to a duplicate of the combiner circuit 50′, the duplicate comprising phase shifters 202 and 204, couplers 208 and 212 and phase shifter 210. The duplicate combiner has two outputs available from the final hybrid coupler 212. These outputs are applied to a phase discriminator 214 which in turn has two outputs I and Q. The action of the phase discriminator 214 is to generate two voltages I and Q which are proportional to the errors in the settings of the previous phase shifters 202, 206 and 210. The phase discriminator 214 is a conventional device, which accepts two input signals and produces two outputs, I and Q. The I output is proportional to the cosine of the phase difference between the two input signals, and the Q output is proportional to the sine of the phase difference. The outputs I and Q are also proportional to the product of the two amplitudes of the two input signals. Thus, if either input signal is zero, both I and Q outputs are zero. The voltage I is amplified and applied to the phase shifter 210; the voltage Q is amplified by amplifier 216 and applied to phase shifter 202 and through inverter 204 to phase shifter 206. This forms feedback loops which automatically adjust the phase shifters for optimum combining for any input polarization. The phase shifter settings are then transferred to the actual combiner circuit 50′ that then does the final combining. The sample and hold circuits 218, 220 and 222 between the calibration and combining circuits 150′ and 50′, controlled by sample and hold controller 224, prevent the transfer of noise into the combiner 50′ as well as holding the settings for the falling edge of a pulsed signal.

It is understood that the above-described embodiments are merely illustrative of the possible specific embodiments which may represent principles of the present invention. For example, the invention is not limited to use with a receive antenna system which provides signal components which are orthogonally polarized. While the output signal is maximized in that case, benefits will be obtained for any two independent antennas which are not of the same polarization sense. Other arrangements may readily be devised in accordance with these principles by those skilled in the art without departing from the scope of the invention.

What is claimed is:

1. An adaptive polarization combining system, comprising:

a receive antenna responsive to an incoming RF signal from a single source and having a first port for providing received first component signals of a first polarization sense of said incoming signal and a second port for providing received second component signals of a second polarization sense of said incoming signal;

means for providing time delayed versions of said first and second component signals;

a calibration circuit responsive to said undelayed first and second component signals and comprising amplitude detecting means for detecting the relative amplitudes of said first and second component signals and providing amplitude detector signals indicative of said relative amplitudes, and phase detecting means for detecting the relative phase differential between said first and second component signals and providing a phase detector signal indicative of said phase differential; and an adjustable combiner circuit responsive to said delayed versions of first and second component signals and comprising means for electronically adjusting the phase and amplitude of the respective delayed first and second component signals and for combining the phase and amplitude adjusted signals at a single combiner output port to thereby polarization match the system to the polarization of the received signal and maximize the signal-to-noise ratio of the combiner output port signals, said combiner circuit comprising means responsive to said amplitude detector signals and said phase detector signals for adjusting the phase and amplitude of said delayed versions of said first and second signals without loss of information or distortion of the received signal waveform.

2. The combining system of claim 1 wherein said adjustable combiner circuit comprises means responsive to said phase detector signal for electronically equalizing the phase of said delayed versions of said first and second component signals, first 90° hybrid coupler means for receiving as inputs said phase equalized delayed versions of said first and second component signals, and providing as first and second hybrid output signals which are equal in amplitude but have a phase differential dependent on the relative amplitudes of the delayed versions of said first and second component signals, means responsive to said amplitude detector signals for electronically adjusting the relative phase of said first hybrid outputs to be 90° different in phase, and second 90° hybrid coupler means having first and second input ports and at least one output port for combining the phase adjusted first hybrid output signals so that substantially all the power appears at the second hybrid output port as said combiner circuit output.

3. The combining system of claim 1 wherein said receive antenna comprises a polarization diverse antenna, wherein said first and second polarization senses are orthogonal to each other.

4. A polarization-adaptive combining system, comprising:

a receive antenna responsive to an incoming RF signal from a single source and having a first port for providing received first component signals of a first polarization sense of said incoming signal and a second port for providing received second component signals of a second polarization sense of said incoming signal;

means for providing time delayed versions of said first and second component signals;

an adjustable combiner circuit responsive to said delayed versions of first and second component signals and comprising means for electronically adjusting the phase and amplitude of the respective delayed first and second component signals and for combining the phase and amplitude adjusted signals at a single combiner output port to thereby polarization match the system to the polarization of the received signal without loss of information or distortion of the received signals and maximize the signal-to-noise ratio of the combiner output port signals, said circuit comprising means for electronically equalizing the phase of the delayed versions of said first and second component signals, first hybrid coupler means for receiving as inputs said phase equalized delayed versions of said first and second component signals and providing as first and second hybrid outputs signals which are equal in amplitude but have a phase differential dependent on the relative amplitudes of the delayed versions of said first and second component signals, means for adjusting the relative phase of said first hybrid outputs, and second hybrid coupler means having first and second input ports and first and second output ports for combining the phase adjusted first hybrid output signals so that substantially all the power appears at said first output port of said second coupler means as said combiner circuit output; and a calibration circuit comprising a duplicate circuit of said adjustable combiner circuit and responsive to said undelayed first and second component signals, a phase discriminator which receives as input signals the outputs from the respective output ports of the second hybrid coupler means of said duplicate circuit and provides a first output signal proportional to the cosine of the phase difference between the two input signals to the phase discriminator and to the produce of the amplitudes of the two input signals, and a second output signal proportional to the sine of said phase difference and to said produce, and feedback means for controlling said means for adjusting the relative phase of said first hybrid outputs of said duplicate circuit by said first discriminator output signal, and for controlling said means for adaptively equalizing the phase of said first and second component signals of said duplicate circuit by said second discriminator output signal, said feedback means operating in a closed loop fashion such that said phase discriminator output signals are proportional to the errors in the adjustments of said phase adjusting means and said phase equalizing means.

5. The system of claim 4 wherein said feedback means further controls said means for adjusting the relative phase of said first hybrid output signals of said adjustable combiner circuit by said first discriminator output signal, and controls said means for equalizing the adjustable combiner circuit by said second discriminator output signal.

6. An adaptive polarization combining system, comprising:

a polarization diverse receive antenna for reception of a signal of arbitrary polarization, said antenna having a first port for providing received first component signals of said signal of a first polarization sense and a second port for providing received second component signals of said signal of a second polarization sense, said first and second senses being orthogonal to each other;

means for sampling said first and second component signal to provide first port sample signals and second port sample signals;

means for providing time delayed versions of said first and second component signals;

a calibration circuit responsive to said first and second port sample signals and comprising amplitude detecting means for detecting the relative amplitudes of said first and second port sample signals and providing amplitude detector signals indicative of said relative amplitudes, and phase detecting means for detecting the relative phase differential between said first and second port sample signals and providing a phase detector signal indicative of said phase differential; and an adjustable combiner circuit responsive to said delayed versions of the first and second component signals and comprising means for electronically adjusting the phase and amplitude of the respective delayed versions of the first and second component signals and for combining the phase and amplitude adjusted signals at a single combiner output port to thereby polarization match the system to the polarization of the received signal without loss of information or distortion of the received signal and maximize the signal-to-noise ratio of the combiner output port signals.

7. The combining system of claim 6 wherein said sampling means comprises first coupler means coupling said first port to said combiner circuit, and second coupler means coupling said second port to said combiner circuit, said first coupler means providing said first port sample signal and said second coupler means providing said second port sample signal.

8. The combining system of claim 6 wherein said adjustable combiner circuit comprises means for electronically equalizing the phase of said first and second port signals, first 90° hybrid coupler means for receiving as inputs said phase equalized first and second port signals and providing as first and second hybrid outputs signals which are equal in amplitude but have a phase differential dependent on the relative amplitudes of the first and second port signals, means for adjusting the relative phase of said first hybrid outputs to be 90° different in phase, and second 90° hybrid output signals so that substantially all the power appears at the second hybrid output port as said combiner circuit output.

9. The combining system of claim 8 wherein said means for electronically equalizing the phase of said first and second port signals is controlled by said phase detector signal and said means for adjusting the relative phase of said first hybrid outputs is controlled by said amplitude detector signals.

10. The combining system of claim 9 wherein said equalizing means comprises at least one variable phase shifter device whose setting is controlled by said phase detector signals, and wherein said adjusting means comprises at least one variable phase shifter device whose setting is controlled by said amplitude detector signals.

* * * * *